US012796047B2

(12) United States Patent
Lin

(10) Patent No.: US 12,796,047 B2
(45) Date of Patent: Nov. 10, 2026

(54) SEMICONDUCTOR DEVICE AND METHOD FOR FORMING THE SAME

(71) Applicant: Powerchip Semiconductor Manufacturing Corporation, Hsinchu (TW)

(72) Inventor: Meng-Han Lin, Hsinchu City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 406 days.

(21) Appl. No.: 18/592,403

(22) Filed: Feb. 29, 2024

(65) Prior Publication Data

US 2025/0234614 A1 Jul. 17, 2025

(30) Foreign Application Priority Data

Jan. 12, 2024 (TW) ................................ 113101446

(51) Int. Cl.

| | |
|---|---|
| ***H10D 64/01*** | (2025.01) |
| ***H10D 62/10*** | (2025.01) |
| ***H10D 62/13*** | (2025.01) |
| ***H10P 52/40*** | (2026.01) |

(52) U.S. Cl.

CPC ......... *H10D 64/017* (2025.01); *H10D 62/115* (2025.01); *H10D 62/151* (2025.01); *H10P 52/403* (2026.01)

(58) Field of Classification Search

CPC ............................ H10D 64/017; H10P 52/403

See application file for complete search history.

(56) References Cited

U.S. PATENT DOCUMENTS

| | | | |
|---|---|---|---|
| 8,237,227 | B2 | 8/2012 | Lai et al. |
| 9,299,696 | B2 | 3/2016 | Chuang et al. |
| 9,601,489 | B2 | 3/2017 | Chern et al. |
| 10,510,685 | B2 | 12/2019 | Chen et al. |
| 11,264,402 | B2 | 3/2022 | Wu et al. |

(Continued)

FOREIGN PATENT DOCUMENTS

| | | |
|---|---|---|
| TW | 201010052 | 3/2010 |

OTHER PUBLICATIONS

"Office Action of Taiwan Counterpart Application", issued on Nov. 22, 2024, p. 1-p. 8.

*Primary Examiner* — Jeff W Natalini
*Assistant Examiner* — Jacob Raul Marin
(74) *Attorney, Agent, or Firm* — JCIPRNET

(57) ABSTRACT

Provided are a semiconductor device and a method for forming the same. The semiconductor device includes a substrate including first and second active regions defined by an element isolation structure, a first element in the first active region and including a gate structure on the substrate, a second element in the second active region and including an insulation pattern in the substrate and including a first portion and a second portion surrounding the first portion, and a dummy gate structure in the second active region and including first and second patterns respectively on the first and second portions and a third pattern on the device isolation structure. The second portion and the element isolation structure define a region where a first doped region of the second element is formed. The second portion and the first portion define a region where a second doped region of the second element is formed.

16 Claims, 13 Drawing Sheets

(56) References Cited

U.S. PATENT DOCUMENTS

| | | | | |
|---|---|---|---|---|
| 2013/0020654 | A1* | 1/2013 | Yamada | H10D 84/0177 257/369 |
| 2015/0008537 | A1* | 1/2015 | Zhu | H10D 30/0217 257/407 |
| 2019/0103367 | A1 | 4/2019 | Chen et al. | |
| 2020/0303388 | A1* | 9/2020 | Reznicek | H10B 41/47 |
| 2020/0365600 | A1* | 11/2020 | Chao | H10B 10/00 |
| 2021/0407900 | A1* | 12/2021 | Yu | H10D 30/014 |
| 2023/0299217 | A1* | 9/2023 | Chiang | G02B 6/12004 257/432 |
| 2023/0352478 | A1* | 11/2023 | Hsiung | H10D 84/82 |
| 2025/0234614 | A1* | 7/2025 | Lin | H10D 62/115 |
| 2025/0324723 | A1* | 10/2025 | Chuang | H10D 30/027 |

* cited by examiner

SEMICONDUCTOR DEVICE AND METHOD FOR FORMING THE SAME

CROSS-REFERENCE TO RELATED APPLICATION

This application claims the priority benefit of Taiwan application serial no. 113101446, filed on Jan. 12, 2024. The entirety of the above-mentioned patent application is hereby incorporated by reference herein and made a part of this specification.

BACKGROUND

Technical Field

The present invention is related to a semiconductor device and a method for forming the same.

Description of Related Art

In the current semiconductor manufacturing process, replacing the traditional polysilicon gate with a high-k metal gate (HKMG) is one of techniques to improve the performance of semiconductor devices. In the process of forming the HKMG, a gate-last technique is usually adopted to form a metal gate of metal-oxide-semiconductor field-effect transistor (MOSFET). Namely, the metal gate of a gate structure is formed at last during the process of forming the gate structure of the MOSFET. For example, in the gate-last technique, a dummy gate is usually formed in advance to reserve a space where the metal gate is to be formed in the subsequent process. After forming an insulation layer (ILD0) surrounding the gate structure, the dummy gate is removed and then a metal material is filled into the space to replace the dummy gate with the metal gate.

In the process of forming the insulation layer surrounding the gate structure, a planarization process (e.g., a chemical mechanical polishing (CMP) process) is usually adopted to remove excess insulation materials, so that a top surface of the dummy gate can be exposed and then the subsequent process of replacing the dummy gate with the metal gate can be performed. However, the above CMP process may affect semiconductor components in other positions. For example, the insulation layer (also referred to as ILD0 ISO) that forms on a substrate and covers semiconductor components (e.g., a shallow trench isolation (STI) well resistor) embedded in the substrate includes a large area that does not form any structure, as such a dishing may occur in the ILD0 ISO where the semiconductor components are disposed thereunder. As such, in the process of replacing the dummy gate with the metal gate, the metal material is prone to retain in the dishing and thus cannot be removed during the CMP process, so that the residual metal material may cause pollution because it may be peeled off in the subsequent processes.

SUMMARY

The present invention provides a semiconductor device and a method of forming the same in which a dummy gate structure is disposed in the a second active region and includes a first pattern on the first portion of the insulation pattern, a second pattern on the second portion of the insulation pattern, and a third pattern on the element isolation structure, so that the dummy gate structure is provided above a second element embedded in a substrate and therefore a dishing is not prone to generate in the insulation layer above the second element during the CMP process. As such, in the process of replacing the dummy gate with the metal gate, the metal material would not retain in the dishing generated in the CMP process and thus the pollution caused by the metal material peeling off from the dishing in the subsequent processes can be avoided.

An embodiment of the present application provides a semiconductor device including a substrate, a first element, a second element, and a dummy gate structure. The substrate includes a first active region and a second active region defined by an element isolation structure. The first element is disposed in the first active region and includes a gate structure disposed on the substrate and source/drain regions disposed in the first active region at opposite sides of the gate structure. The second element is disposed in the second active region and includes an insulation pattern embedded in the substrate and a first doped region and second doped regions in the substrate. The insulation pattern includes a first portion and a second portion surrounding the first portion. The second portion and the element isolation structure define a region in the second active region where the first doped region is formed therein. The second portion and the first portion define a region in the second active region where the second doped regions are formed therein. The dummy gate structure is disposed in the second active region and includes a first pattern disposed on the first portion of the insulation pattern, a second pattern disposed on the second portion of the insulation pattern, and a third pattern disposed on the element isolation structure.

In some embodiments, the gate structure includes a first high dielectric constant layer, a first capping layer and a first metal gate disposed on the substrate sequentially, and the dummy gate structure includes a second high dielectric constant layer, a second capping layer and a second metal gate disposed on the substrate sequentially, and the first metal gate and the second metal gate are disposed at the same level height respective to the substrate.

In some embodiments, the first pattern includes annular patterns, dot patterns, or strip patterns arranged in a first direction and extending in a second direction.

In some embodiments, the second doped regions of the second element extend in the first direction and are spaced apart from each other in the second direction.

In some embodiments, the first doped region of the second element surrounds the insulation pattern and has a conductivity type different from the second doped regions.

In some embodiments, the semiconductor device further includes a first dielectric structure and a second dielectric structure. The first dielectric structure is disposed between the first pattern and the second pattern of the dummy gate structure above the substrate. The second dielectric structure is disposed between the second pattern and the third pattern of the dummy gate structure above the substrate. The first dielectric structure and the second dielectric structure are spaced apart from each other.

In some embodiments, the first dielectric structure covers the second doped regions, and the second dielectric structure covers the first doped region.

In some embodiments, the substrate includes a first well region disposed in the second active region and having a first conductivity type, a second well region disposed in the first well region and having a second conductivity type different from the first conductivity type, and a deep well region disposed in the second active region below the second well region and having the second conductivity type. The first doped region is disposed in the first well region, and the second doped regions are disposed in the second well region. The second well region is configured below the first portion of the insulation pattern, the first doped region has the first conductivity type, and the second doped regions have the second conductivity type.

In some embodiments, the dummy gate structure is electrically floating.

An embodiment of the present application provides a method of forming a semiconductor device including: forming an element isolation structure defining a first active region and a second active region in a substrate; forming a first element in the first active region of the substrate, wherein the first element includes a gate structure formed on the substrate; forming a second element in the second active region of the substrate, wherein the second element includes an insulation pattern embedded in the substrate and a first doped region and second doped regions formed in the substrate, the insulation pattern includes a first portion and a second portion surrounding the first portion, the second portion and the element isolation structure define a region in the second active region where the first doped region is formed therein, and the second portion and the first portion define a region in the second active region where the second doped regions are formed therein; and forming a dummy gate structure in the second active region of the substrate, wherein the dummy gate structure includes a first pattern formed on the first portion of the insulation pattern, a second pattern formed on the second portion of the insulation pattern, and a third pattern formed on the element isolation structure.

In some embodiments, the gate structure includes a first high dielectric constant layer, a first capping layer and a first metal gate formed on the substrate sequentially, and the dummy gate structure includes a second high dielectric constant layer, a second capping layer and a second metal gate formed on the substrate sequentially, and the first metal gate and the second metal gate are formed at the same level height respective to the substrate.

In some embodiments, a process of forming the first metal gate and the second metal gate includes a chemical mechanical polishing (CMP) process.

In some embodiments, the second doped regions of the second element are formed to extend in a first direction and to be spaced apart from each other in a second direction.

In some embodiments, the first doped region of the second element is formed to surround the insulation pattern and has a conductivity type different from the second doped regions.

In some embodiments, the method of forming the semiconductor device further includes: forming a first dielectric structure between the first pattern and the second pattern of the dummy gate structure above the insulation pattern; and forming a second dielectric structure between the second pattern and the third pattern of the dummy gate structure above the insulation pattern, wherein the first dielectric structure and the second dielectric structure are spaced apart from each other.

In some embodiments, the first dielectric structure covers the second doped regions, and the second dielectric structure covers the first doped region.

In some embodiments, the substrate includes a first well region formed in the second active region and having a first conductivity type, a second well region formed in the first well region and having a second conductivity type different from the first conductivity type, and a deep well region formed in the second active region below the second well region and having the second conductivity type. The first doped region is formed in the first well region, and the second doped regions are formed in the second well region. The second well region is formed below the first portion of the insulation pattern, the first doped region has the first conductivity type, and the second doped regions have the second conductivity type.

In some embodiments, the dummy gate structure is electrically floating.

Based on the above, in the aforementioned semiconductor device and method of forming the same, the dummy gate structure is disposed in the a second active region and includes a first pattern on the first portion of the insulation pattern, a second pattern on the second portion of the insulation pattern, and a third pattern on the element isolation structure, so that the dummy gate structure is provided above a second element embedded in a substrate and therefore a dishing is not prone to generate in the insulation layer above the second element during the CMP process. As such, in the process of replacing the dummy gate with the metal gate, the metal material would not retain in the dishing generated in the CMP process and thus the pollution caused by the metal material peeling off from the dishing in the subsequent processes can be avoided.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
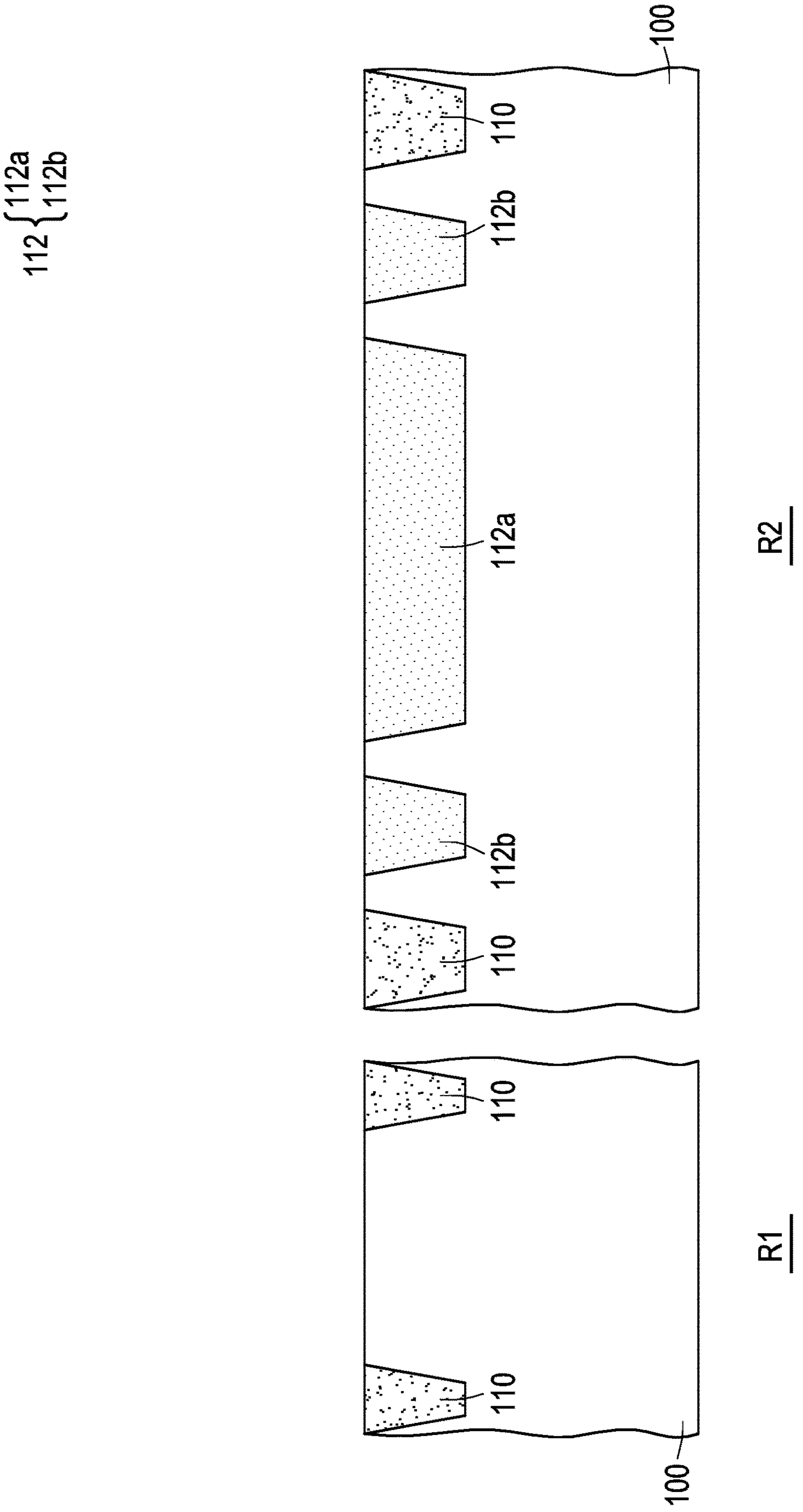
FIG. 1 to FIG. 10 is schematic cross-section views illustrating a method of forming a semiconductor device in an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

The invention will be described more comprehensively below with reference to the drawings for the embodiments. However, the invention may also be implemented in different forms rather than being limited by the embodiments described in the invention. Thicknesses of layer and region in the drawings are enlarged for clarity. The same reference numbers are used in the drawings and the description to indicate the same or like parts, which are not repeated in the following embodiments.

It will be understood that when an element is referred to as being "on" or "connected" to another element, it may be directly on or connected to the other element or intervening elements may be present. If an element is referred to as being "directly on" or "directly connected" to another element, there are no intervening elements present. As used herein, "connection" may refer to both physical and/or electrical connections, and "electrical connection" or "coupling" may refer to the presence of other elements between two elements. As used herein, "electrical connection" may refer to the concept including a physical connection (e.g., wired connection) and a physical disconnection (e.g., wireless connection).

As used herein, "about", "approximately" or "substantially" includes the values as mentioned and the average values within the range of acceptable deviations that can be determined by those of ordinary skill in the art. Consider to the specific amount of errors related to the measurements (i.e., the limitations of the measurement system), the meaning of "about" may be, for example, referred to a value within one or more standard deviations of the value, or within ±30%, ±20%, ±10%, ±5%. Furthermore, the "about", "approximate" or "substantially" used herein may be based on the optical property, etching property or other properties to select a more acceptable deviation range or standard deviation, but may not apply one standard deviation to all properties.

The terms used herein are used to merely describe exemplary embodiments and are not used to limit the present disclosure. In this case, unless indicated in the context specifically, otherwise the singular forms include the plural forms.

Figure 8:
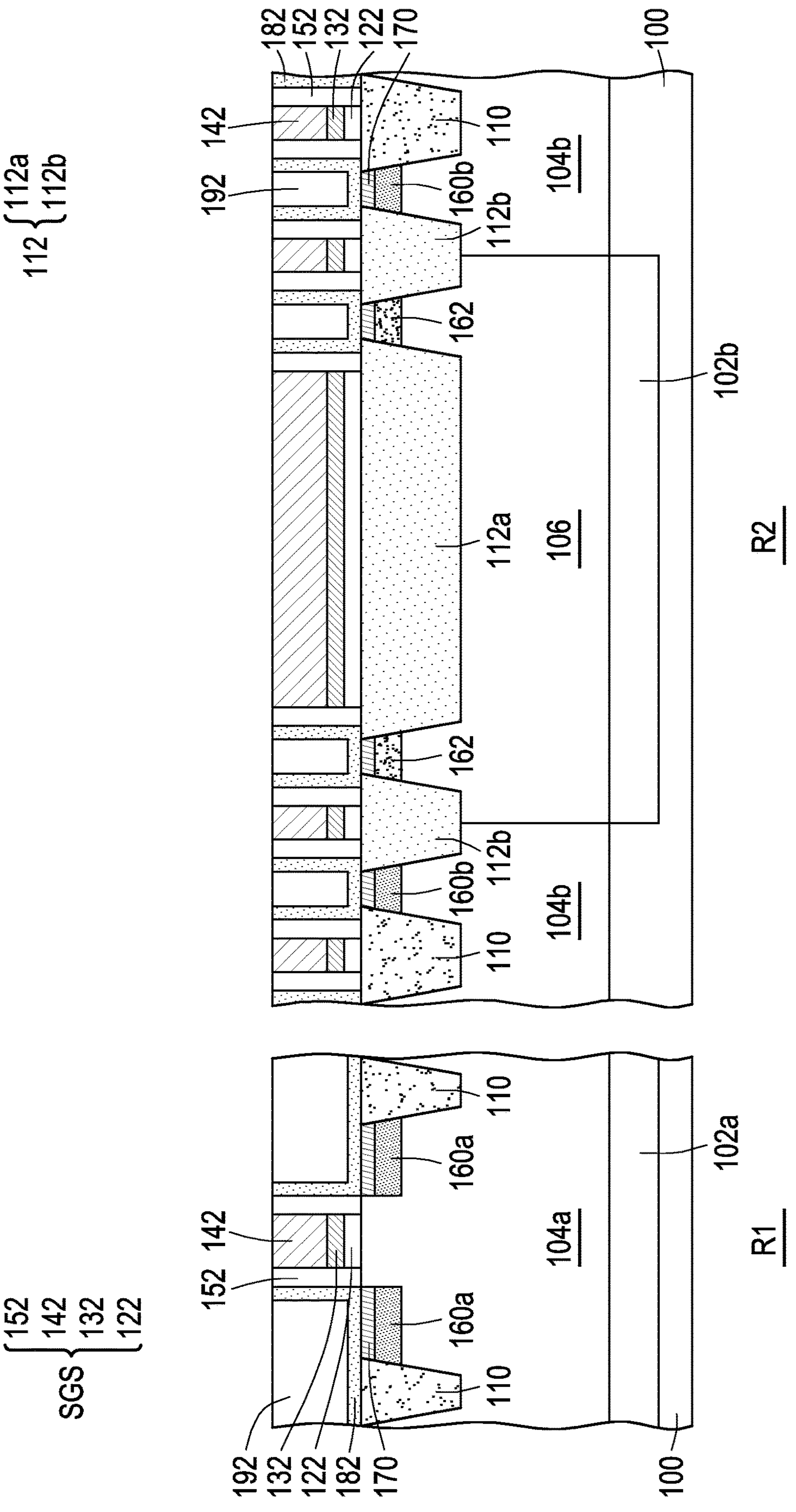
Figure 9:
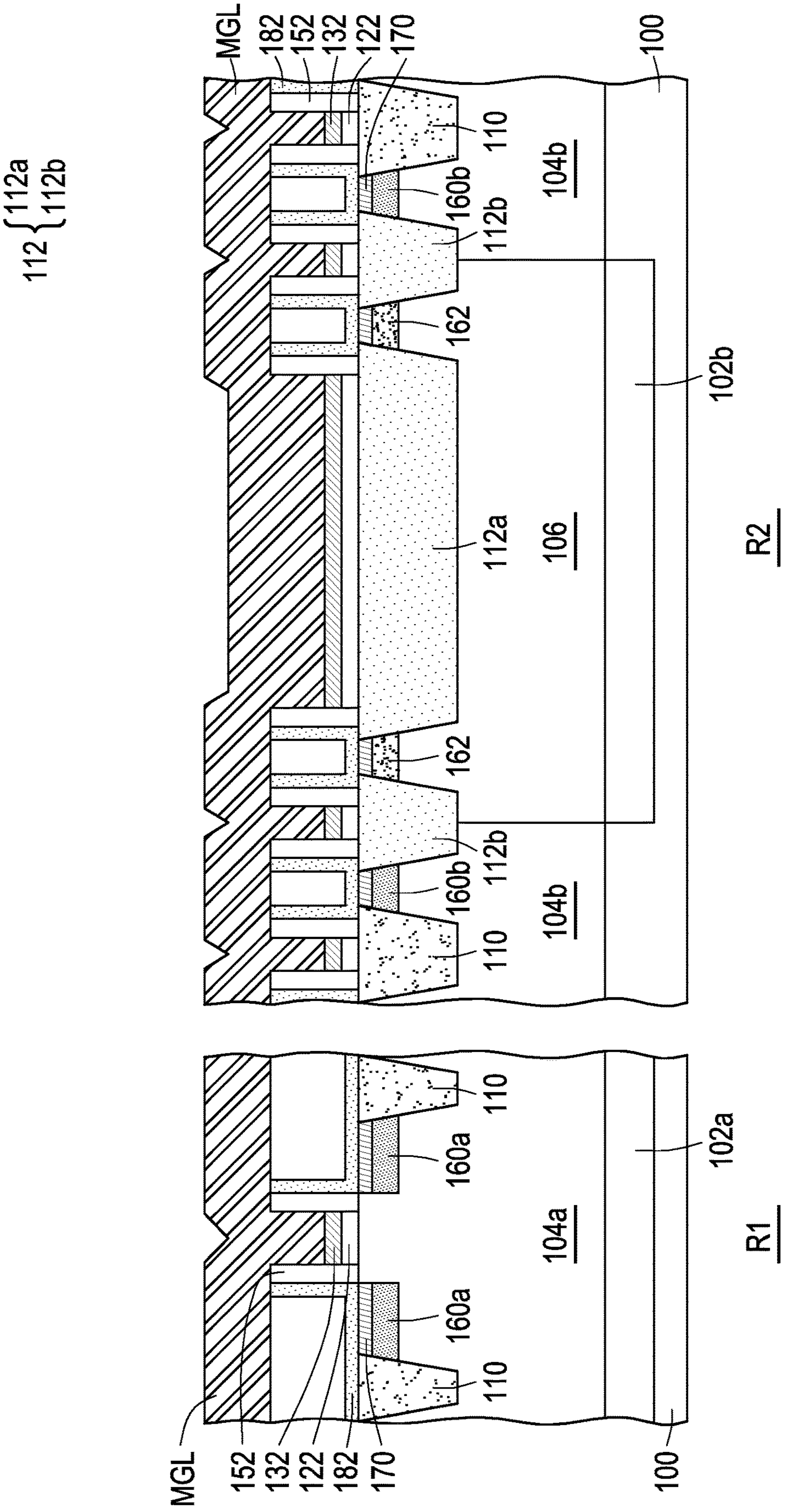
Figure 10:
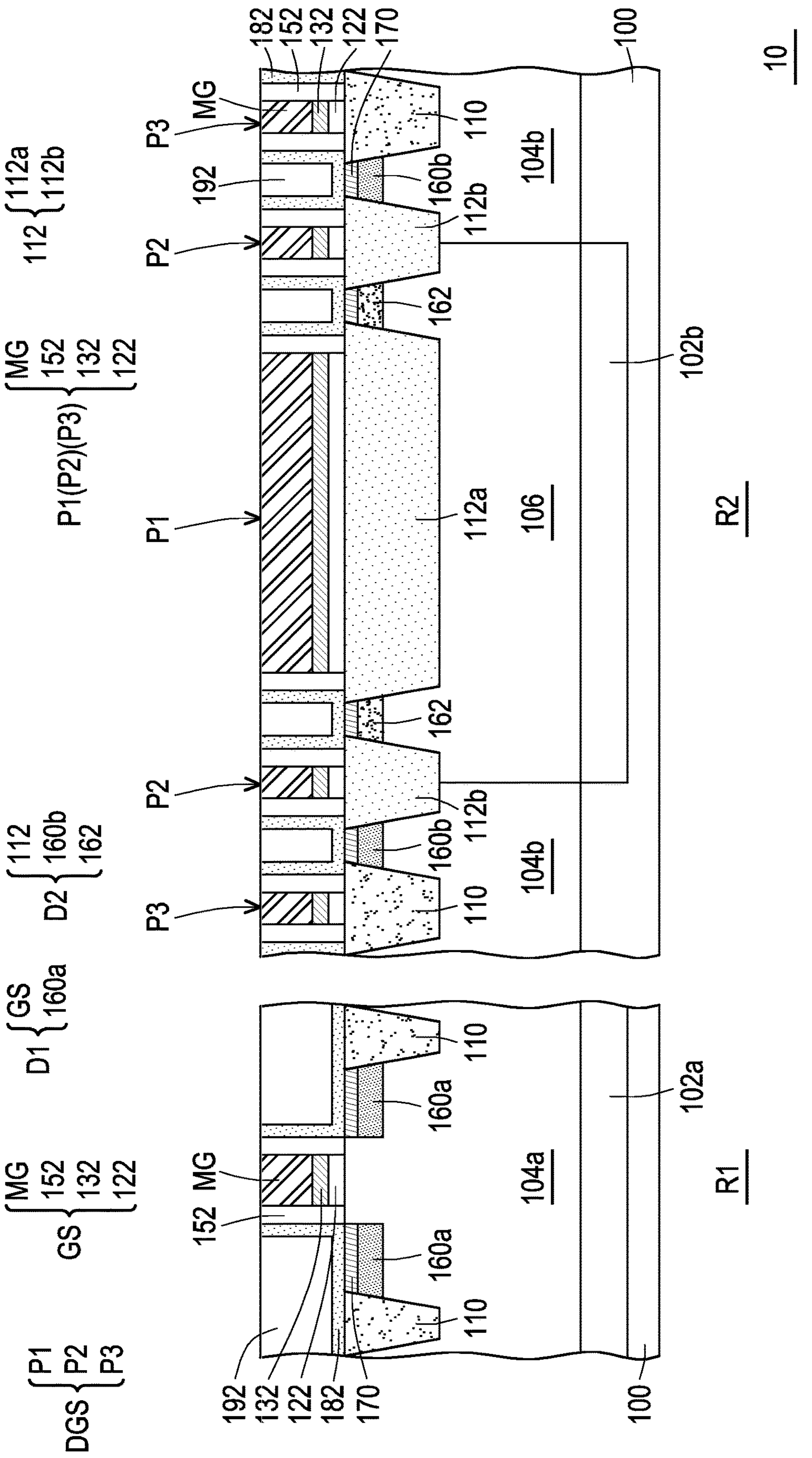
Figure 11:
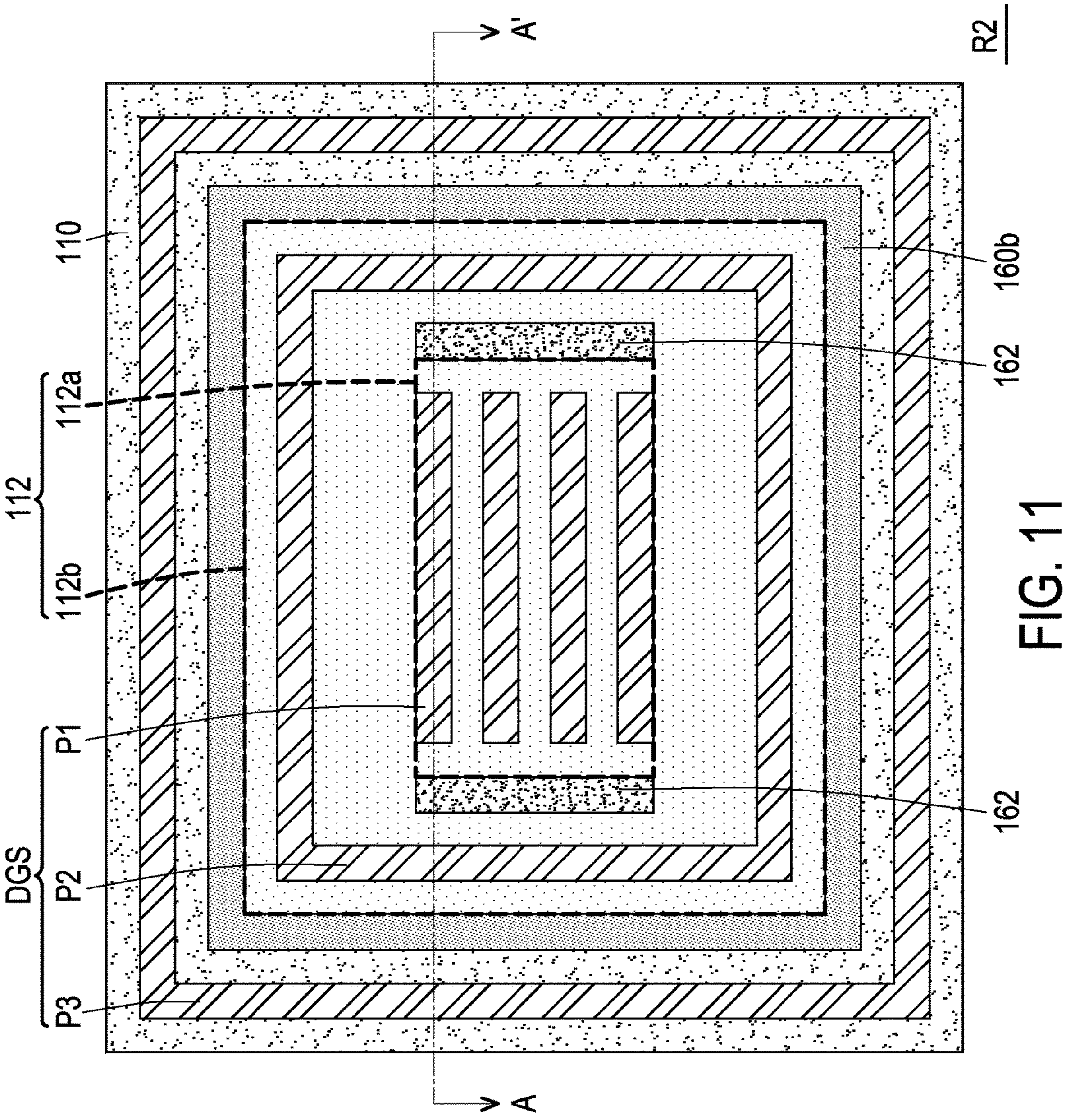
FIG. 11 is a schematic top view of the semiconductor device in an embodiment of the invention.
Figure 12:
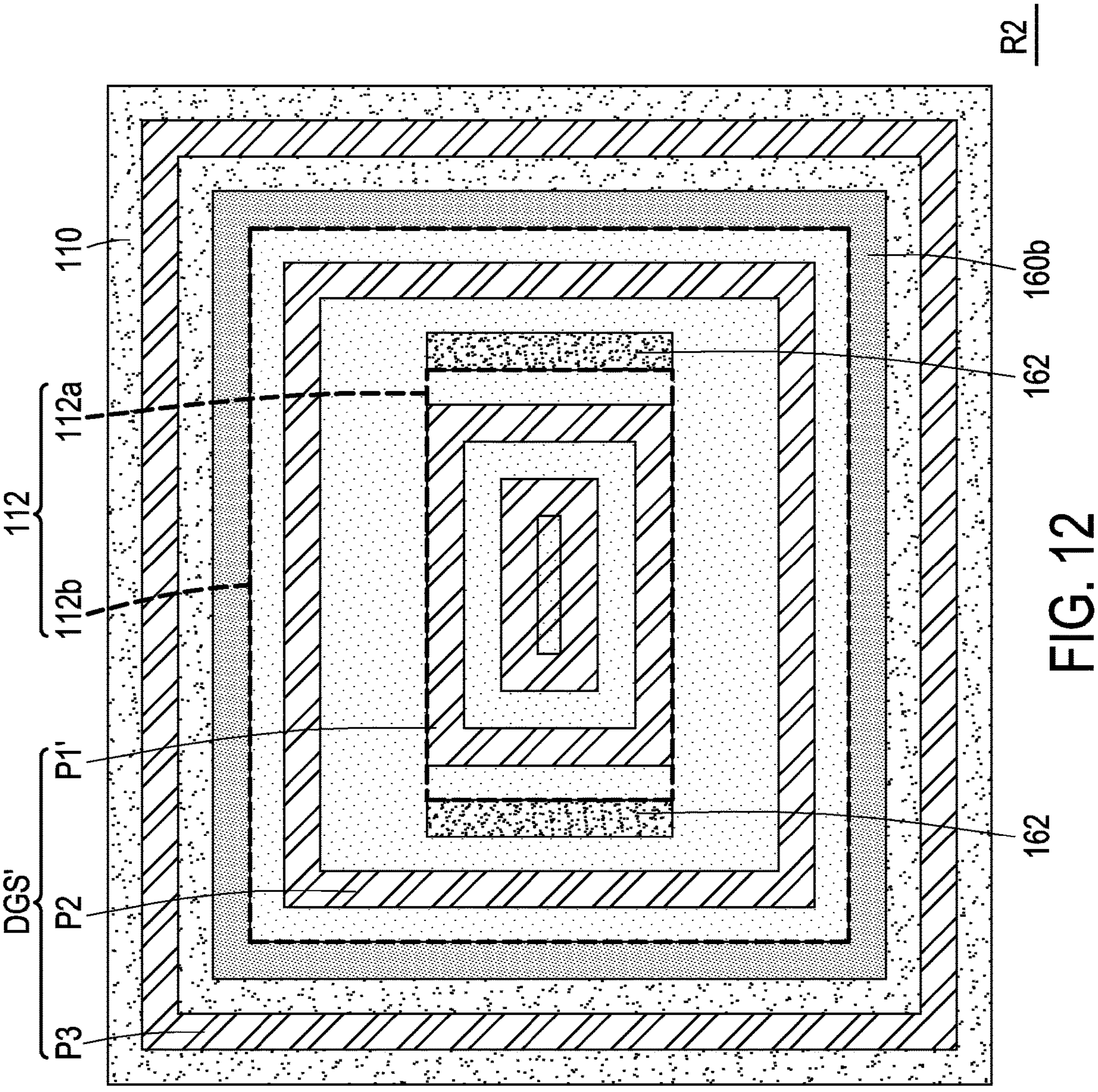
FIG. 12 is a schematic top view of the semiconductor device in another embodiment of the invention.
Figure 13:
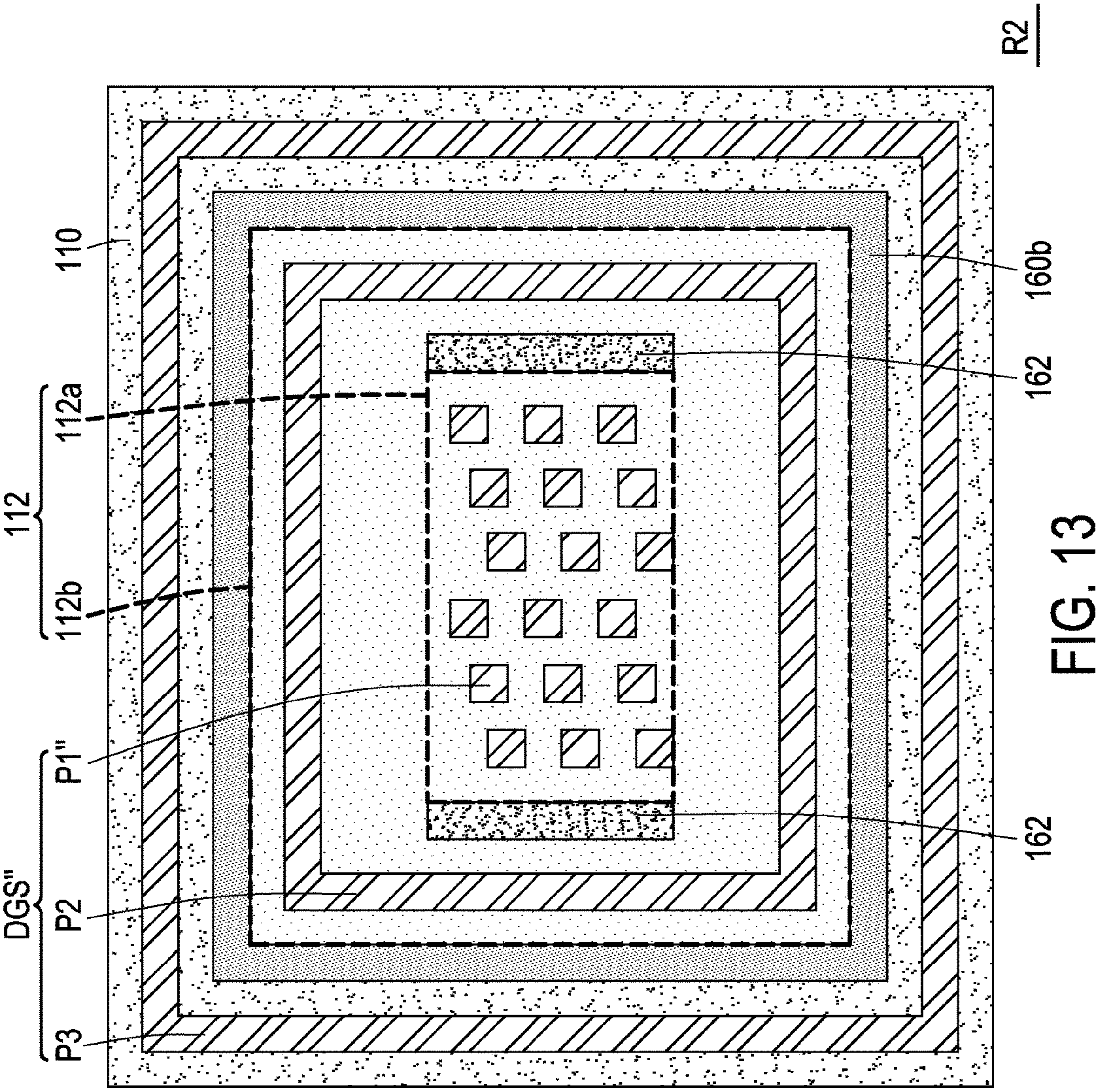
FIG. 13 is a schematic top view of the semiconductor device in yet another embodiment of the invention.

FIG. 1 to FIG. 10 is schematic cross-section views illustrating a method of forming a semiconductor device in an embodiment of the invention. FIG. 11 is a schematic top view of the semiconductor device in an embodiment of the invention. FIG. 10 may be a cross-section view taken along a line A-A' of FIG. 11. FIG. 12 is a schematic top view of the semiconductor device in another embodiment of the invention. FIG. 13 is a schematic top view of the semiconductor device in yet another embodiment of the invention.

In some embodiments, a method of forming a semiconductor device (e.g., a semiconductor device 10 shown in FIG. 10) includes the following steps.

Firstly, referring to FIG. 1, an element isolation structure 110 defining a first active region R1 and a second active region R2 is formed in a substrate 100. The substrate 100 may include a semiconductor substrate or a semiconductor-on-insulator (SOI) substrate. The semiconductor materials in the semiconductor substrate or in the SOI substrate may include an element semiconductor, an alloy semiconductor, or a compound semiconductor. For example, the element semiconductor may include Si or Ge. The alloy semiconductor may include SiGe, SiGeC, or the like. The compound semiconductor may include SiC, III-V semiconductor materials, or II-VI semiconductor materials. The III-V semiconductor materials may include GaN, GaP, GaAs, AlN, AlP, AlAs, InN, InP, InAs, GaNP, GaNAs, GaPAs, AlNP, AlNAs, AlPAS, InNP, InNAs, InPAs, GaAlNP, GaAlNAs, GaAlPAs, GaInNP, GaInNAs, GaInPAs, InAlNP, InAlNAs, or InAlPAs. The II-VI semiconductor materials may include CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe, or HgZnSTe. The semiconductor material may be doped with a dopant of a first conductivity type or a dopant of a second conductivity type complementary to the first conductivity type. For example, the first conductivity type may be p-type, whereas the second conductivity type may be n-type. In some embodiments, the substrate 100 may be doped with a p-type dopant. The element isolation structure 110 may include materials such as silicon oxide suitable for the element isolation structure.

Next, a first element (e.g., a first element D1 of FIG. 10) is formed in the first active region R1 of the substrate 100, a second element (e.g., a second element D2 of FIG. 10) is formed in the second active region R2 of the substrate 100, and a dummy gate structure (e.g., dummy gate structure DGS of FIG. 10) is formed in the second active region R2 of the substrate 100. In some embodiments, the first element may be a metal gate of metal-oxide-semiconductor field-effect transistor (MOSFET), and the second element may be a STI well resistor. In some embodiments, the first element, the second element, and the dummy gate structure may be formed by the following steps.

Firstly, referring to FIG. 1, in the process of forming the element isolation structure 110, an insulation pattern 112 embedded in the substrate 100 is formed in the second active region R2. The insulation pattern 112 includes a first portion 112*a* and a second portion 112*b* surrounding the first portion 112*a*. The second portion 112*b* and the element isolation structure 110 define a region in the second active region R2 where a first doped region (e.g., a doped region 160*b* shown in FIG. 5) is formed therein. The second portion 112*b* and the first portion 112*a* define a region in the second active region R2 where second doped regions (e.g., doped regions 162 shown in FIG. 5) are formed therein. The insulation pattern 112 may include insulation materials such as silicon oxide. In some embodiments, the insulation pattern 112 and the element isolation structure 110 may be formed simultaneously in the same process. In some embodiments, the insulation pattern 112 may be a continuous layer including openings corresponding to the positions of second doped regions 162 (as shown in FIG. 11).

Figure 2:
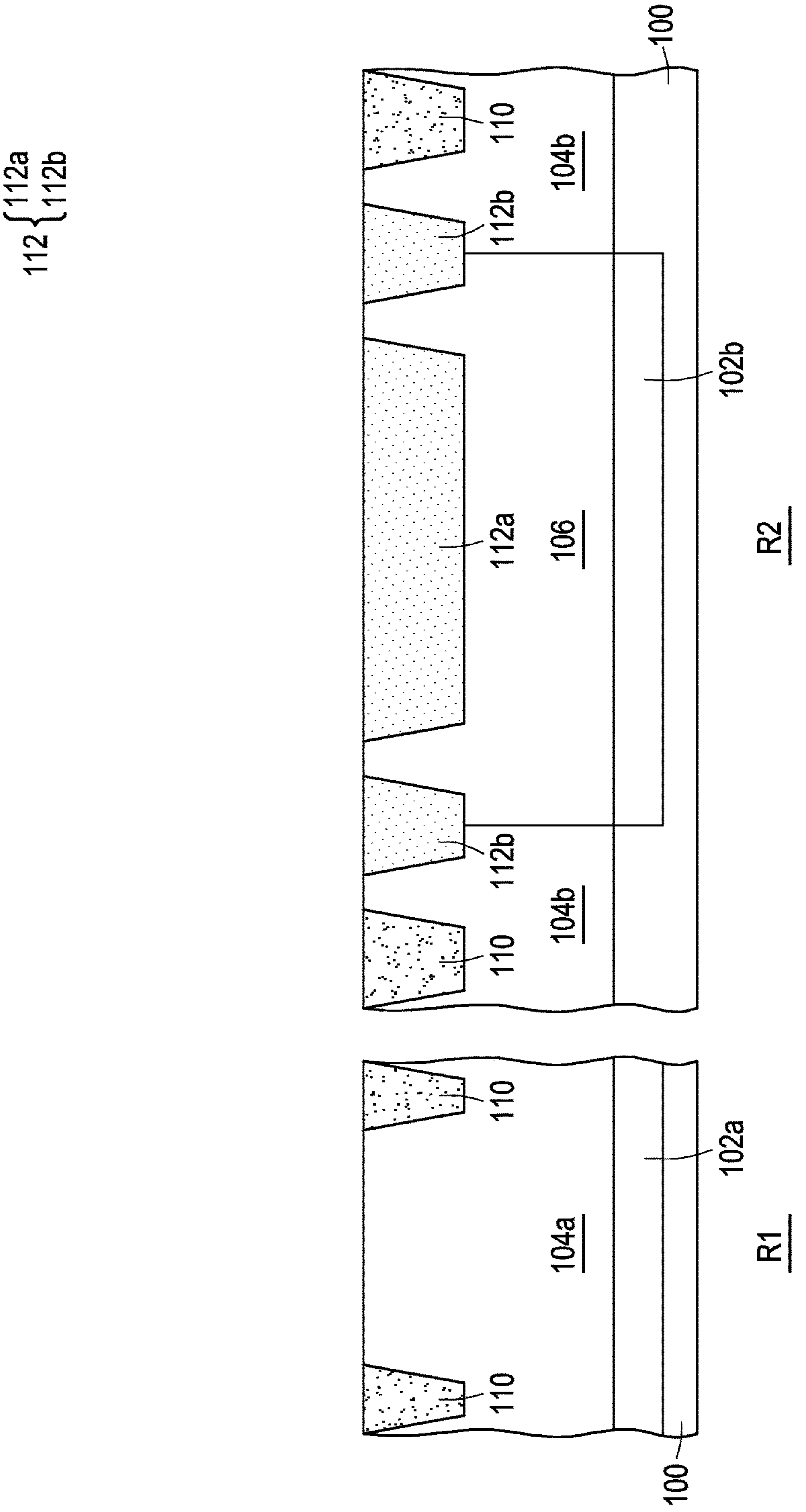

Next, referring to FIG. 2, a deep well region 102*a* and a deep well region 102*b* having the second conductively type (e.g., n-type) are formed in the first active region R1 and the second active region R2 of the substrate 100, respectively. In some embodiments, the deep well region 102*b* is formed below the first portion 112*a* of the insulation pattern 112 and extends laterally to the position under the second portion 112*b* of the insulation pattern 112. Then, a well region 104*a* having the first conductivity type (e.g., p-type) different from the second conductively type is formed in the deep well region 102*a*, and a well region 104*b* having the first conductivity type (e.g., p-type) is formed in the deep well region 102*b* and in the second active region R2 around the deep well region 102*b*. After that, a well region 106 having the second conductively type (e.g., n-type) is formed in the well region 104*b* formed in the deep well region 102*a*. Namely, as shown in FIG. 2, the substrate 100 may include a first well region (e.g., the well region 104*b*) formed in the second active region R2 and having the first conductivity type, a second well region (e.g., the well region 106) formed in the first well region and having the second conductivity type different from the first conductivity type, and the deep well region 102*b* formed in the second active region R2 below the second well region and having the second conductivity type, wherein the second well region (e.g., the well region 106) may be formed below the first portion 112*a* of the insulation pattern 112.

Figure 3:
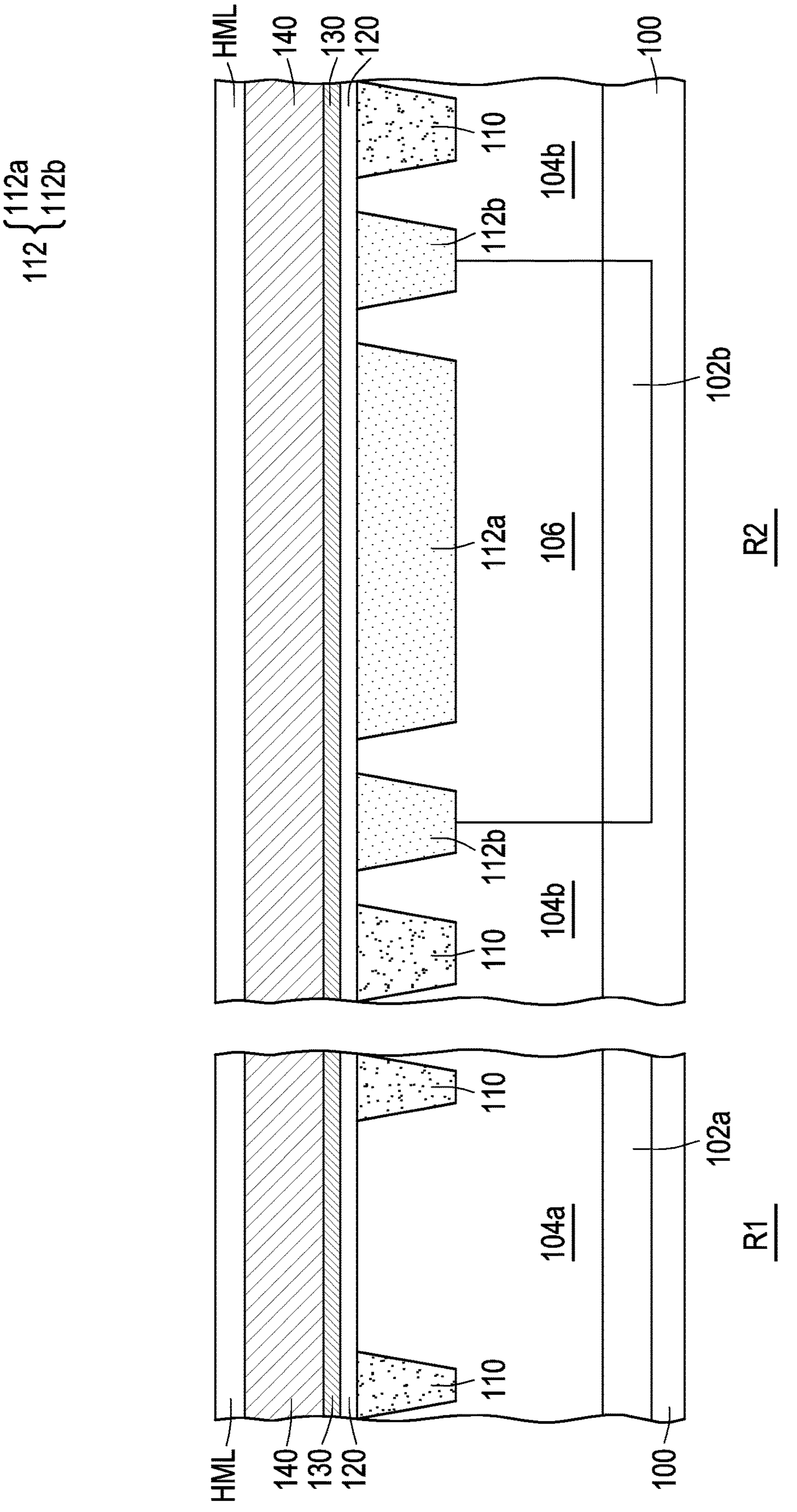

Then, referring to FIG. 3, a high dielectric constant material layer 120, a capping material layer 130, a sacrificial gate material layer 140, and a hard mask material layer HML are formed on the substrate 100 sequentially.

The high dielectric constant material layer 120 may include dielectric materials with high dielectric constants. For example, the dielectric materials with high dielectric constant may be materials having dielectric constants higher than that of silicon oxide (about 3.9). In some embodiments, the high dielectric constant material layer 120 may include $HfO_2$, $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, BaZrO, HfZrO, HfLaO, HfSiO, LaSiO, AlSiO, HfTaO, HfTIO, $Al_2O_3$, $Si_3N_4$, SiON or combinations thereof. The capping material layer 130 may include TiN. The sacrificial gate material layer 140 may include polysilicon. The hard mask material layer HML may include oxides, nitrides or combinations thereof.

Figure 4:
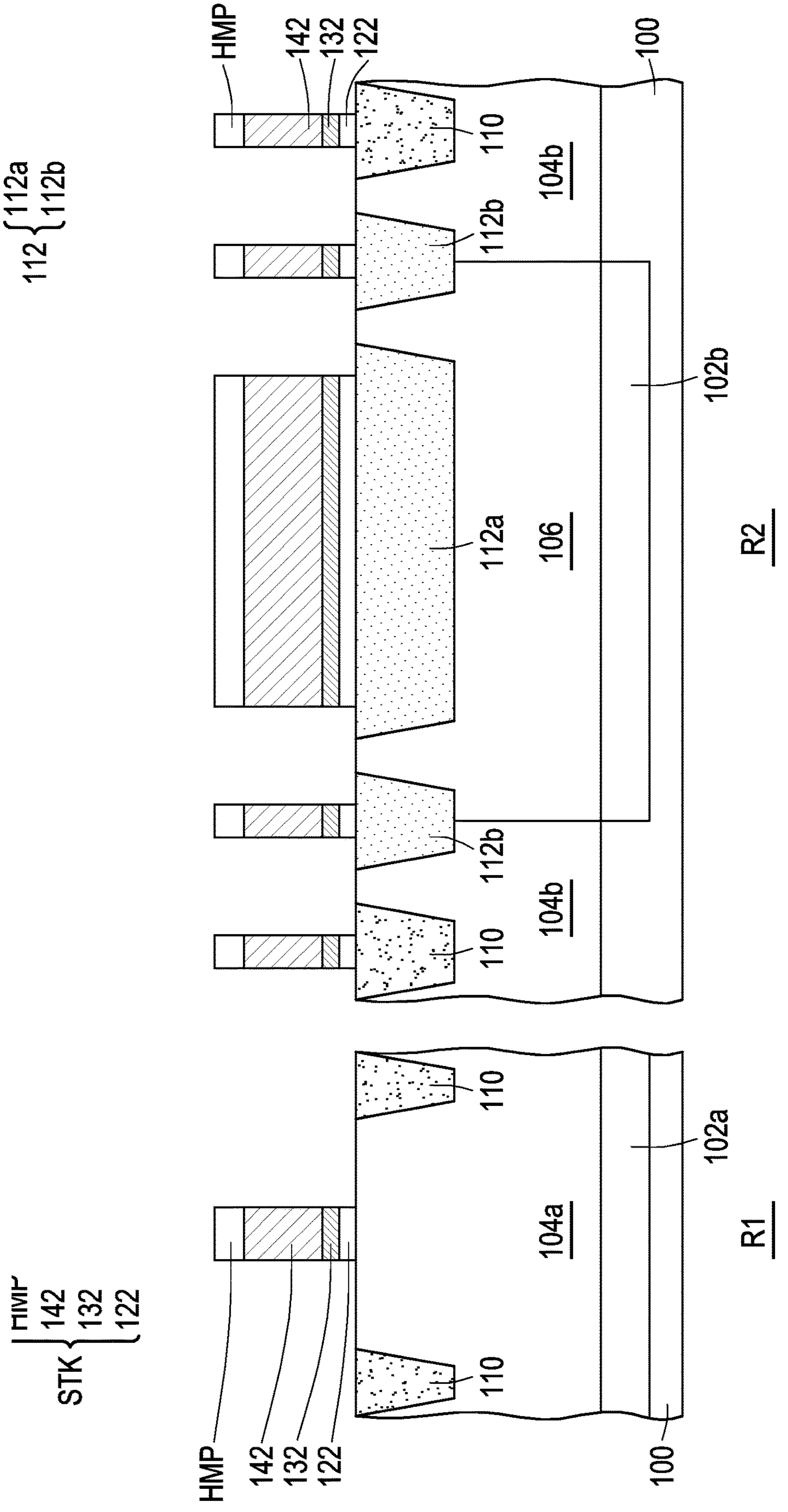

After that, referring to FIG. 3 and FIG. 4, a patterning process is performed on the high dielectric constant material layer 120, the capping material layer 130, the sacrificial gate material layer 140, and the hard mask material layer HML to form stacked structures STK, and each of the stacked structures STK includes a high dielectric constant layer 122, a capping layer 132, a sacrificial gate layer 142, and a hard mask layer HMP. In the first active region R1, the stacked structure STK may be arranged on the well region 104*a* of the substrate 100. In the second active region R2, the stacked structures STK may include a first stacked structure arranged on the first portion 112*a* of the insulation pattern 112, a second stacked structure arranged on the second portion 112*b* of the insulation pattern 112, and a third stacked structure arranged on the element isolation structure 110. In some embodiments, the first stacked structure, the second stacked structure, and the third stacked structure are spaced apart from each other.

Figure 5:
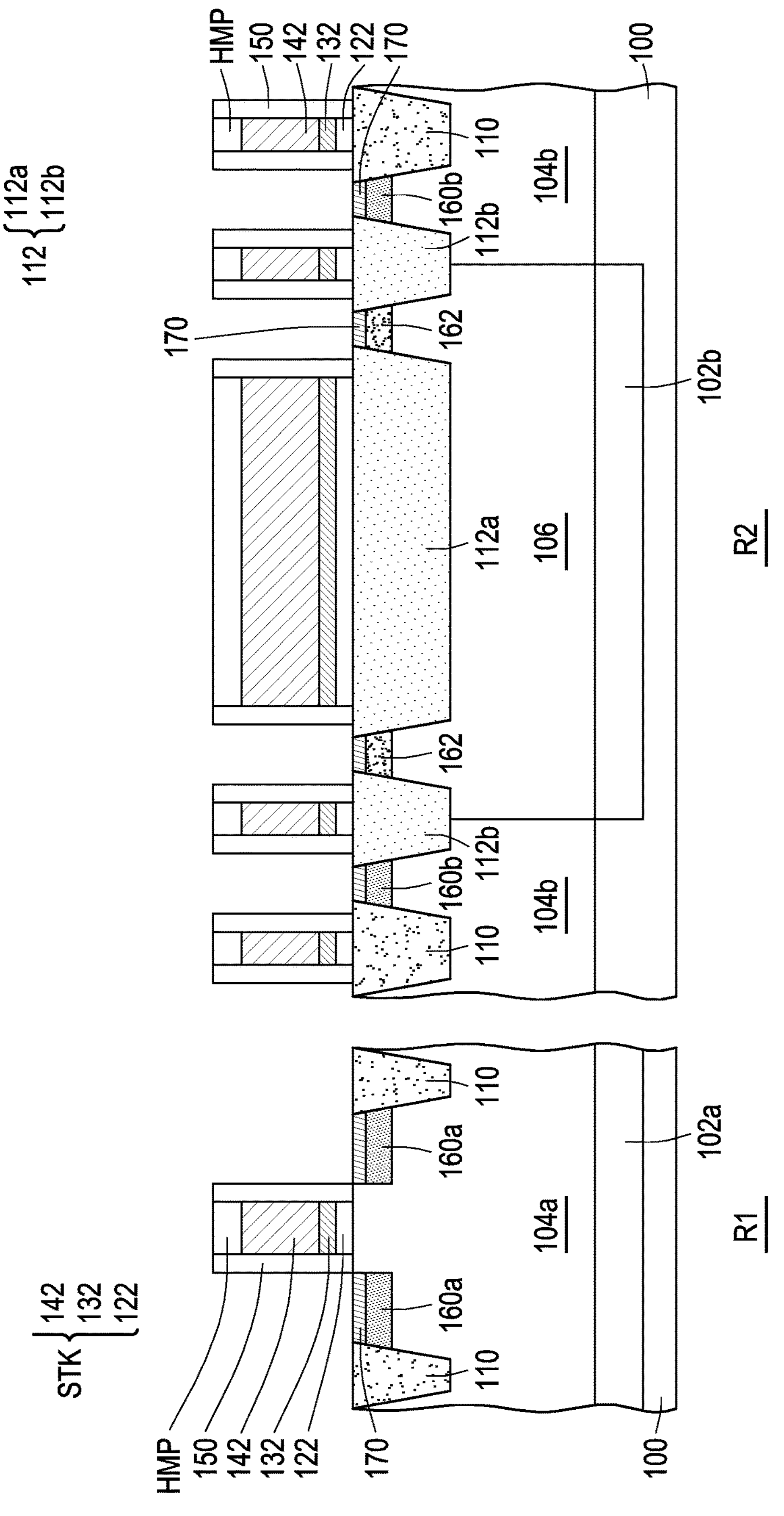

Then, referring to FIG. 4 and FIG. 5, spacers 150 are formed on the opposite sidewalls of each stacked structure STK. The spacers 150 may include a silicon oxide, a silicon nitride, or a combination thereof.

Next, a first doping process is performed on the first active region R1 and the second active region R2 to form doped regions 160*a* having the first conductivity type in the well region 104*a* at the opposite sides of the stacked structure STK and to form a doped region 160*b* having the first conductivity type in a region defined by the second portion 112*b* of the insulation pattern 112 and the element isolation structure 110 in the well region 104*b*. After that, a second doping process is performed on the second active region R2 to form doped regions 162 having the second conductivity type in a region defined by the second portion 112*b* and the first portion 112*a* of the insulation pattern 112 in the well region 106. As such, the second element embedded in the substrate 100 and including the insulation pattern 112, the doped region 160*b*, and the doped regions 162 may be formed in the second active region R2. In some embodiments, as shown in FIG. 11, the doped regions 162 may be formed to extend in a first direction (e.g., a vertical direction) and to be spaced apart from each other in a second direction (e.g., a horizontal direction). In some embodiments, the first direction may be perpendicular to the second direction. In some embodiments, the doped region 160*b* may be formed to surround the insulation pattern 112 and has conductivity type different from the doped regions 162.

Then, silicide layers 170 are formed in the doped regions 160*a*, the doped region 160*b*, and the doped regions 162 by a self-aligned silicide process. In some embodiments, the second element may further include the silicide layers 170 formed in the doped region 160*b* and the doped regions 162. The silicide layers 170 may include silicide such as tungsten silicide, titanium silicide, cobalt silicide, zirconium silicide, platinum silicide, molybdenum silicide, copper silicide, nickel silicide, or combinations thereof.

Figure 6:
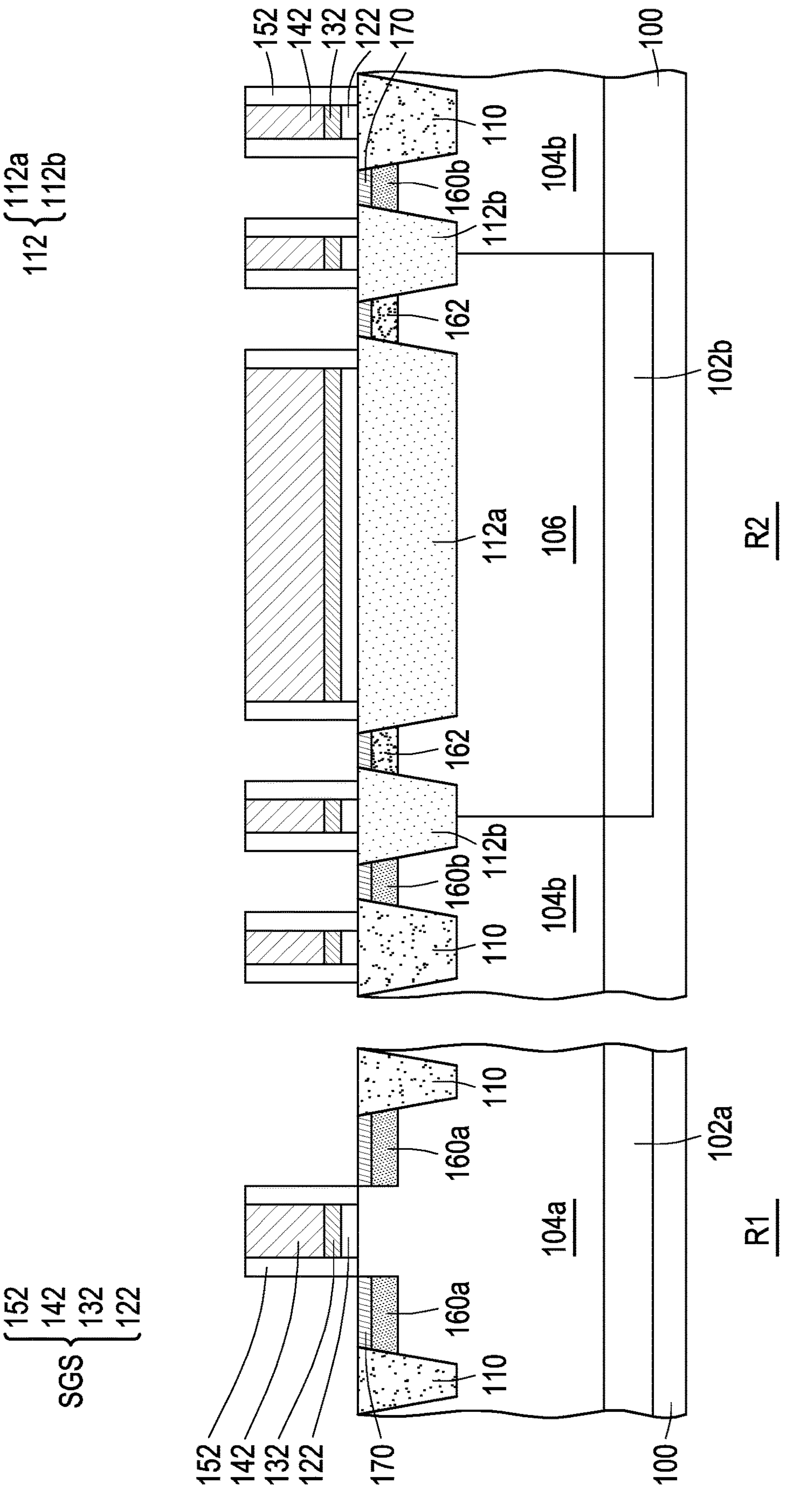

After that, referring to FIG. 5 and FIG. 6, the hard mask layers HMP of the stacked structures STK are removed to form sacrificial gate structures SGS. In the step of removing the hard mask layers HMP, portions of the spacers 150 located on side surfaces of the hard mask layers HMP are removed as well, so each of the sacrificial gate structures SGS includes the high dielectric constant layer 122, the capping layer 132, the sacrificial gate layer 142, and the spacers 152.

Figure 7:
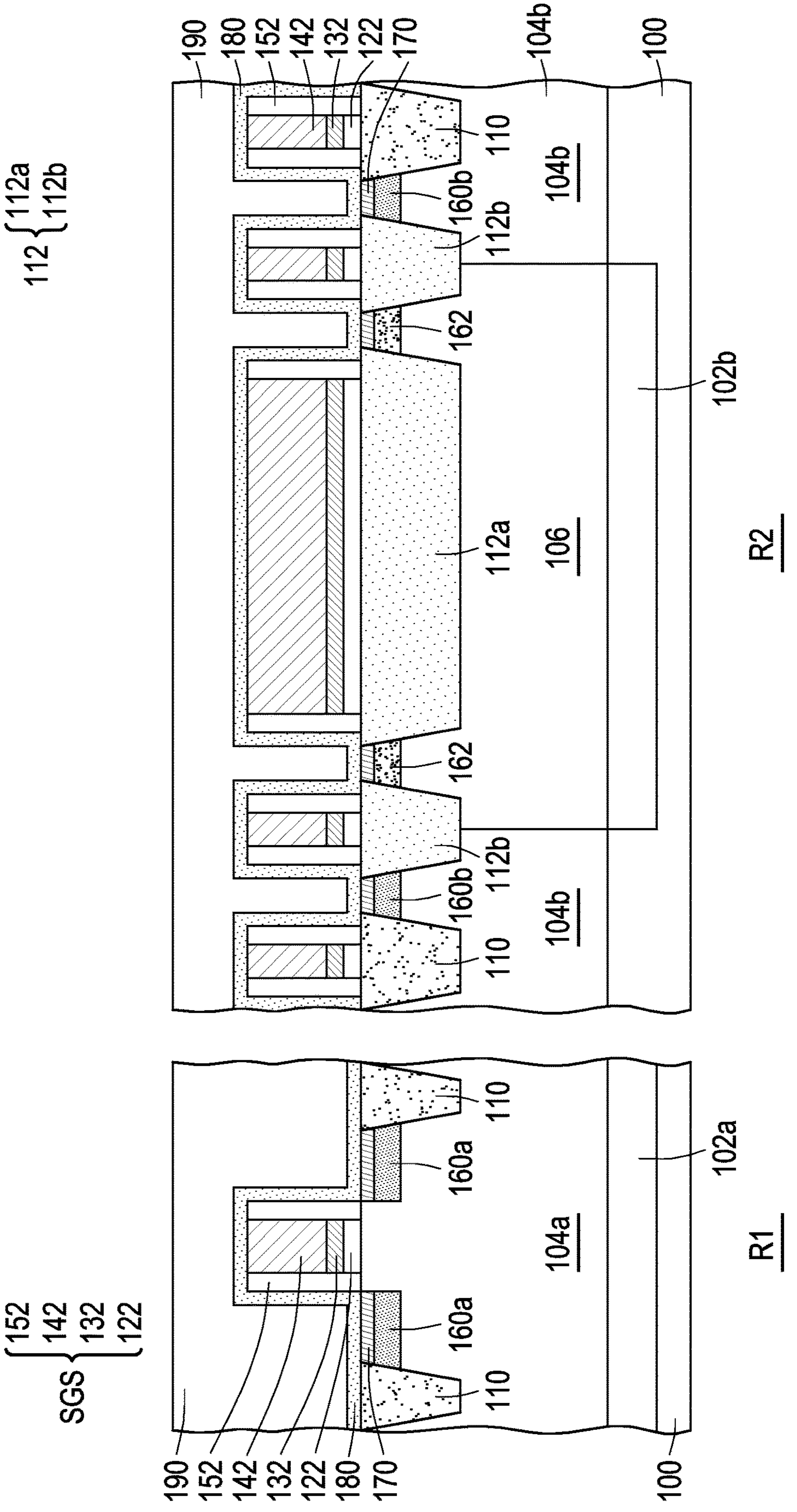

Then, referring to FIG. 6 and FIG. 7, an etching stop material layer 180 and a dielectric material layer 190 are formed on the substrate 100 sequentially. The etching stop material layer 180 may be conformally formed on surfaces of the substrate 100 and the sacrificial gate structures SGS. The dielectric material layer 190 may cover the sacrificial gate structures SGS. The etching stop material layer 180 may include materials such as silicon nitride. The dielectric material layer 190 may include dielectric materials such as silicon oxide.

After that, referring to FIG. 7 and FIG. 8, a planarization process (e.g., the CMP process) is performed on the dielectric material layer 190 and the etching stop material layer 180 so as to form a dielectric layer 192 and an etching stop layer 182. In the above planarization process, the sacrificial gate structures SGS in the second active region R2 are beneficial to avoid a dishing generated in the dielectric material layer 190 formed above the second element embedded in the second active region R2 of the substrate 100 during the CMP process. As such, in the subsequence process of replacing the sacrificial gate layers 142 with the metal gate layers (e.g., metal gates MG shown in FIG. 10), the metal materials would not retain in the dishing generated in the CMP process and thus the pollution caused by the metal materials peeling off from the dishing in the subsequent processes can be avoided.

In some embodiments, a first dielectric structure including the dielectric layers 192 and the etching stop layer 182 is formed between the sacrificial gate structures SGS on the first portion 112*a* and the second portion 112*b* of the insulation pattern 112, and a second dielectric structure including the dielectric layers 192 and the etching stop layer 182 is formed between the sacrificial gate structures SGS on the second portion 112*b* of the insulation pattern 112 and the element isolation structure 110. The first dielectric structure and the second dielectric structure are spaced apart from each other by the sacrificial gate structure SGS disposed on the second portion 112*b* of the insulation pattern 112. In some embodiments, the first dielectric structure covers the doped regions 162, and the second dielectric structure cover the doped region 160*b*. In some embodiments, the dielectric layer 192 may be an interlayer dielectric layer (e.g., ILD0). In some embodiments, the etching stop layer 182 may be a contact etch stop layer (CESL).

Next, referring to FIG. 8 and FIG. 9, the sacrificial gate layers 142 of the sacrificial gate structures SGS are removed, and then a metal material layer MGL is filled into spaces formed by removing the sacrificial gate layers 142. The metal material layer MGL is also formed on the first dielectric structure and the second dielectric structure. The metal material layer MGL may include tantalum nitride (TaN), nickel silicon (NiSi), cobalt silicon (CoSi), molybdenum (Mo), copper (Cu), tungsten (W), aluminum (Al), cobalt (Co), zirconium (Zr), platinum (Pt) or other suitable materials.

Then, referring to FIG. 9 and FIG. 10, a planarization process such as CMP is performed on the metal material layer MGL to form a gate structure GS on the first active region R1 of the substrate 100 and to form a dummy gate structure DGS on the second active region R2 of the substrate 100. The first element D1 may include the gate structure GS formed on the substrate 100. In the case where the first element D1 is the MOSFET, the first element D1 can be operated by applying a voltage to the gate structure GS. The dummy gate structure DGS may be electrically floating. In the case where the second element D2 is the STI well resistor, the dummy gate structure DGS may be electrically isolated from the second element D2.

The dummy gate structure DGS may include first patterns P1, a second pattern P2, and a third pattern P3. The first patterns P1 are formed on the first portion 112*a* of the insulation pattern 112. The second pattern P2 is formed on the second portion 112*b* of the insulation pattern 112. The third pattern P3 is formed on the element isolation structure 110. Each of the gate structure GS and the first to third patterns P1, P2 and P3 of the dummy gate structure DGS may include the high dielectric constant layer 122, the capping layer 132, the metal gate MG, and the spacers 152. In some embodiments, the metal gate MG of the gate structure GS and the metal gate MG of the dummy gate structure DGS are formed at the same level height respective to the substrate 100. In some embodiments, the processes of forming the metal gates MG of the gate structure GS and the dummy gate structure DGS include at least two planarization processes (e.g., the CMP processes).

In some embodiments, referring to FIG. 10 and FIG. 11, the above first dielectric structure is formed between the first patterns P1 and the second pattern P2 of the dummy gate structure DGS above the insulation pattern 112. The first patterns P1 and the second pattern P2 may be spaced apart from each other by the first dielectric structure. The above second dielectric structure is formed between the second pattern P2 and the third pattern P3 of the dummy gate structure DGS above the insulation pattern 112. The second pattern P2 and the third pattern P3 may be spaced apart from each other by the second dielectric structure.

In some embodiments, as shown in FIG. 11, the first patterns P1 of the dummy gate structure DGS may include strip patterns arranged in the first direction (e.g., the vertical direction) and extending in the second direction (e.g., the horizontal direction). In some other embodiments, as shown in FIG. 12, the first patterns P1' of the dummy gate structure DGS' may include annular patterns. In some alternative embodiments, as shown in FIG. 13, the first patterns P1" of the dummy gate structure DGS" may include dot patterns. The dot patterns may be circular dot patterns or rectangular dot patterns, but is not limited thereto. In some embodiments, the second doped regions 162 of the second element extend in the first direction and are spaced apart from each other in the second direction.

Hereinafter, the semiconductor device 10 will be described with reference to FIG. 10. The semiconductor device 10 may be formed by the aforementioned method, but the invention is not limited thereto.

Referring to FIG. 10, the semiconductor device 10 include a substrate 100, a first element D1, a second element D2, and a dummy gate structure DGS. The substrate 100 includes a first active region R1 and a second active region R2 defined by the element isolation structure 110. The first element D1 is disposed in the first active region R1 and includes a gate structure GS disposed on the substrate 100 and source/drain regions 160*a* disposed in the first active region R1 at the opposite sides of the gate structure GS. The second element D2 is disposed in the second active region R2 and includes an insulation pattern 112 embedded in the substrate 100 and a first doped region 160*b* and second doped regions 162 in the substrate 100. The insulation pattern 112 includes a first portion 112*a* and a second portion 112*b* surrounding the first portion 112*a*. The second portion 112*b* and the element isolation structure 110 define a region in the second active region R2 where the first doped region 160*b* is formed therein. The second portion 112*b* and the first portion 112*a* define a region in the second active region R2 where the second doped regions 162 are formed therein. The dummy gate structure DGS is disposed in the second active region R2 and includes first patterns P1, second pattern P2 and third pattern P3. The first patterns P1 are disposed on the first portion 112*a* of the insulation pattern 112. The second pattern P2 is disposed on the second portion 112*b* of the insulation pattern 112. The third pattern P3 is disposed on the element isolation structure 110.

In some embodiments, the gate structure GS includes a first high dielectric constant layer 122, a first capping layer 132 and a first metal gate MG disposed on the substrate 100 sequentially. The dummy gate structure DGS includes a second high dielectric constant layer 122, a second capping layer 132 and a second metal gate MG disposed on the substrate 100 sequentially. The first metal gate MG of the gate structure GS and the second metal gate MG of the dummy gate structure DGS are disposed at the same level height respective to the substrate 100.

In some embodiments, the first patterns P1 of the dummy gate structure DGS include annular patterns (as shown in FIG. 12), dot patterns (as shown in FIG. 13), or strip patterns (as shown in FIG. 11) arranged in a first direction (e.g., a vertical direction) and extending in a second direction (e.g., a horizontal direction). In some embodiments, the second doped regions 162 of the second element D2 extend in the first direction and are spaced apart from each other in the second direction. In some embodiments, the first doped region 160*b* of the second element D2 surrounds the insulation pattern 112 and has a conductivity type different from the second doped regions 162.

In some embodiments, the semiconductor device 10 further includes a first dielectric structure disposed between the first patterns P1 and the second pattern P2 of the dummy gate structure DGS above the insulation pattern 112 and a second dielectric structure disposed between the second pattern P2 and the third pattern P3 of the dummy gate structure DGS above the insulation pattern 112. The first dielectric structure and the second dielectric structure are spaced apart from each other. For example, the first dielectric structure and the second dielectric structure may be spaced apart from each other by the second pattern P2 of the dummy gate structure DGS. In some embodiments, the first dielectric structure covers the second doped regions 162, and the second dielectric structure covers the first doped region 160*b*.

In some embodiments, the substrate 100 includes a first well region (e.g., the well region 104*b*) disposed in the second active region R2 and having a first conductivity type, a second well region (e.g., the well region 106) disposed in the first well region and having a second conductivity type different from the conductivity type, and a deep well region (e.g., the deep well region 102*b*) disposed in the below the second active region R2 below the second well region and having the second conductivity type. The first doped region 160*b* is disposed in the first well region, and the second doped regions 162 are disposed in the second well region. In some embodiments, the second well region is configured below the first portion 112*a* of the insulation pattern 112, the first doped region 160*b* has the first conductivity type (e.g., p-type), and the second doped regions 162 have the second conductivity type (e.g., n-type). In some embodiments, the dummy gate structure DGS is electrically floating.

Based on the above, according to the semiconductor device and the method of forming the same in the aforementioned embodiments, the sacrificial gate structures in the second active region are beneficial to avoid a dishing generated in the dielectric material layer 190 formed above the second element embedded in the second active region R2 of the substrate 100 during the CMP process. As such, in the subsequence process of replacing the sacrificial gate layers with the metal gate layers, the metal materials would not retain in the dishing generated in the CMP process and thus the pollution caused by the metal materials peeling off from the dishing in the subsequent processes can be avoided. Namely, after the process of replacing the sacrificial gate layers with the metal gate layers, the sacrificial gate structures in the second active region are formed to be the dummy gate structure including the first patterns on the first portion of the insulation pattern, a second portion on the second portion of the insulation pattern, and a third pattern on the element isolation structure, and the insulation layer formed above the second element (e.g., the insulation layer including the first dielectric structure and the second dielectric structure) would not have the aforementioned dishing generated during the CMP process, and thus the undesired metal materials would not retain in the aforementioned dishing generated during the CMP process.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A semiconductor device, comprising:

a substrate comprising a first active region and a second active region defined by an element isolation structure;

a first element disposed in the first active region and comprising a gate structure disposed on the substrate and source/drain regions disposed in the first active region at opposite sides of the gate structure;

a second element disposed in the second active region and comprising an insulation pattern embedded in the substrate and a first doped region and second doped regions in the substrate, wherein the insulation pattern comprises a first portion and a second portion surrounding the first portion, the second portion and the element isolation structure define a region in the second active region where the first doped region is formed therein, and the second portion and the first portion define a region in the second active region where the second doped regions are formed therein; and a dummy gate structure disposed in the second active region and comprising a first pattern disposed on the first portion of the insulation pattern, a second pattern disposed on the second portion of the insulation pattern, and a third pattern disposed on the element isolation structure, wherein the substrate comprises:

a first well region disposed in the second active region and having a first conductivity type;

a second well region disposed in the first well region and having a second conductivity type different from the first conductivity type, wherein the first doped region is disposed in the first well region, and the second doped regions are disposed in the second well region; and a deep well region disposed in the second active region below the second well region and having the second conductivity type, wherein the second well region is configured below the first portion of the insulation pattern, the first doped region has the first conductivity type, and the second doped regions have the second conductivity type.

2. The semiconductor device of claim 1, wherein the gate structure comprises a first high dielectric constant layer, a first capping layer and a first metal gate disposed on the substrate sequentially, and the dummy gate structure comprises a second high dielectric constant layer, a second capping layer and a second metal gate disposed on the substrate sequentially, and the first metal gate and the second metal gate are disposed at the same level height respective to the substrate.

3. The semiconductor device of claim 1, wherein the first pattern comprises annular patterns, dot patterns, or strip patterns arranged in a first direction and extending in a second direction.

4. The semiconductor device of claim 3, wherein the second doped regions of the second element extend in the first direction and are spaced apart from each other in the second direction.

5. The semiconductor device of claim 4, wherein the first doped region of the second element surrounds the insulation pattern and has a conductivity type different from the second doped regions.

6. The semiconductor device of claim 1, further comprising:

a first dielectric structure disposed between the first pattern and the second pattern of the dummy gate structure above the insulation pattern; and a second dielectric structure disposed between the second pattern and the third pattern of the dummy gate structure above the insulation pattern, wherein the first dielectric structure and the second dielectric structure are spaced apart from each other.

7. The semiconductor device of claim 6, wherein the first dielectric structure covers the second doped regions, and the second dielectric structure covers the first doped region.

8. The semiconductor device of claim 1, wherein the dummy gate structure is electrically floating.

9. A method of forming a semiconductor device, comprising:

forming an element isolation structure defining a first active region and a second active region in a substrate;

forming a first element in the first active region of the substrate, wherein the first element comprises a gate structure formed on the substrate;

forming a second element in the second active region of the substrate, wherein the second element comprises an insulation pattern embedded in the substrate and a first doped region and second doped regions formed in the substrate, the insulation pattern comprises a first portion and a second portion surrounding the first portion, the second portion and the element isolation structure define a region in the second active region where the first doped region is formed therein, and the second portion and the first portion define a region in the second active region where the second doped regions are formed therein; and forming a dummy gate structure in the second active region of the substrate, wherein the dummy gate structure comprises a first pattern formed on the first portion of the insulation pattern, a second pattern formed on the second portion of the insulation pattern, and a third pattern formed on the element isolation structure, wherein the substrate comprises:

a first well region formed in the second active region and having a first conductivity type;

a second well region formed in the first well region and having a second conductivity type different from the first conductivity type, wherein the first doped region is formed in the first well region, and the second doped regions are formed in the second well region; and a deep well region formed in the second active region below the second well region and having the second conductivity type, wherein the second well region is formed below the first portion of the insulation pattern, the first doped region has the first conductivity type, and the second doped regions have the second conductivity type.

10. The method of claim 9, wherein the gate structure comprises a first high dielectric constant layer, a first capping layer and a first metal gate formed on the substrate sequentially, and the dummy gate structure comprises a second high dielectric constant layer, a second capping layer and a second metal gate formed on the substrate sequentially, and the first metal gate and the second metal gate are formed at the same level height respective to the substrate.

11. The method of claim 10, wherein a process of forming the first metal gate and the second metal gate comprises a chemical mechanical polishing (CMP) process.

12. The method of claim 9, wherein the second doped regions of the second element are formed to extend in a first direction and to be spaced apart from each other in a second direction.

13. The method of claim 12, wherein the first doped region of the second element is formed to surround the insulation pattern and has a conductivity type different from the second doped regions.

14. The method of claim 9, further comprising:

forming a first dielectric structure between the first pattern and the second pattern of the dummy gate structure above the insulation pattern; and forming a second dielectric structure between the second pattern and the third pattern of the dummy gate structure above the insulation pattern, wherein the first dielectric structure and the second dielectric structure are spaced apart from each other.

15. The method of claim 14, wherein the first dielectric structure covers the second doped regions, and the second dielectric structure covers the first doped region.

16. The method of claim 9, wherein the dummy gate structure is electrically floating.

* * * * *